(12) United States Patent
Lin et al.

(10) Patent No.: US 7,188,302 B2
(45) Date of Patent: Mar. 6, 2007

(54) PARALLEL DECISION-FEEDBACK DECODER AND METHOD FOR JOINT EQUALIZING AND DECODING OF INCOMING DATA STREAM

(75) Inventors: Hou-Wei Lin, Taipei (TW);
Shieh-Hsing Kuo, Taipei (TW);
Kuang-Yu Yen, Tai-Chung (TW);
Jung-Feng Ho, Chi-Lung (TW)

(73) Assignee: Realtek Semiconductor Corp., HsinChu (TW)

( * ) Notice: Subject to any disclaimer, the term of this patent is extended or adjusted under 35 U.S.C. 154(b) by 337 days.

(21) Appl. No.: 10/709,099

(22) Filed: Apr. 14, 2004

(65) Prior Publication Data

US 2005/0235194 A1 Oct. 20, 2005

(51) Int. Cl.
*H03M 13/03* (2006.01)
(52) U.S. Cl. .................. 714/794; 714/796
(58) Field of Classification Search ............... 714/794, 714/795, 800, 47, 48, 703, 796, 792; 375/262, 375/263, 233
See application file for complete search history.

(56) References Cited

U.S. PATENT DOCUMENTS

| | | | | |
|---|---|---|---|---|
| 5,097,486 A | * | 3/1992 | Newby et al. ............ 375/317 |
| 5,214,672 A | * | 5/1993 | Eyuboglu et al. ........... 375/254 |
| 6,012,161 A | * | 1/2000 | Ariyavisitakul et al. .... 714/795 |
| 6,201,831 B1 | | 3/2001 | Agazzi et al. |
| 6,252,904 B1 | | 6/2001 | Agazzi et al. |
| 6,356,586 B1 | * | 3/2002 | Krishnamoorthy et al. . 375/233 |
| 7,000,175 B2 | * | 2/2006 | Azadet et al. ............... 714/794 |
| 2002/0083396 A1 | | 6/2002 | Azadet et al. |
| 2003/0112885 A1 | | 6/2003 | Azadet et al. |
| 2003/0115541 A1 | | 6/2003 | Azadet et al. |

OTHER PUBLICATIONS

Erich F. Haratsch; A 1-Gb/s Joint Equalizer and Trellis Doceder for 1000BASE-T Gigabit Ethernet; IEEE Journal of Solid-State Circuits; March 2001; p. 374-p. 384; vol. 36, No. 3.

* cited by examiner

*Primary Examiner*—Albert Decady
*Assistant Examiner*—Fritz Alphonse
(74) *Attorney, Agent, or Firm*—Winston Hsu

(57) ABSTRACT

A P-tap parallel decision-feedback decoder (PDFD) is also disclosed. The PDFD includes a plurality of state shift registers. For each state of a code utilized by an incoming data stream, a survivor metric for a state is shifted into the first shift register for the state. Each first shift register has M cells. A decision device is coupled to the first shift registers for outputting a first survivor metric according to survivor metrics in the first shift registers. A second shift register has N delay cells, and the first survivor metric is shifted into the second shift register.

23 Claims, 4 Drawing Sheets

PARALLEL DECISION-FEEDBACK DECODER AND METHOD FOR JOINT EQUALIZING AND DECODING OF INCOMING DATA STREAM

BACKGROUND OF INVENTION

1. Field of the Invention

The invention relates to data communications, and more particularly, to joint equalizing and decoding of an incoming data stream using a parallel decision-feedback decoder (PDFD).

2. Description of the Prior Art

The IEEE 802.3ab standard for gigabit Ethernet, also termed 1000BASE-T, is now considered the future trend in local area network (LAN) applications. Gigabit Ethernet is defined as able to provide 1 gigabit per second (Gbps) bandwidth in combination with the simplicity of an Ethernet architecture, at a lower cost than other technologies of comparable speed. Moreover, gigabit Ethernet offers a smooth, seamless upgrade path for present 10BASE-T or 100BASE-T Ethernet installations.

In order to obtain the requisite gigabit performance levels, gigabit Ethernet transceivers are interconnected with a multi-pair transmission channel architecture. In particular, transceivers are interconnected using four separate pairs of twisted Category-5 copper wires. Gigabit communication, in practice, involves the simultaneous, parallel transmission of information signals, with each signal conveying information at a rate of 250 megabits per second (Mb/s).

In particular, the gigabit Ethernet standard requires that digital information being processed for transmission be symbolically represented in accordance with a five-level pulse amplitude modulation scheme (PAM-5) and encoded in accordance with an 8-state Trellis coding methodology. Coded information is then communicated over a multi-dimensional parallel transmission channel to a designated receiver, where the original information must be extracted (demodulated) from a multi-level signal. In gigabit Ethernet, it is important to note that it is the concatenation of signal samples received simultaneously on all four twisted pair lines of the channel that defines a symbol. Thus, demodulator/decoder architectures must be implemented with a degree of computational complexity that allows them to accommodate not only the "state width" of Trellis coded signals, but also the "dimensional depth" represented by the transmission channel.

Computational complexity is not the only challenge presented to modern gigabit capable communication devices. A perhaps greater challenge is that the complex computations required to process the incoming signals must be performed in very small period of time. For example, in gigabit applications, each of the four-dimensional signal samples, formed by the four signals received simultaneously over the four twisted wire pairs, must be efficiently decoded within a particular allocated symbol time window of about 8 nanoseconds.

In addition to the challenges imposed by decoding and demodulating multilevel signal samples, transceiver systems must also be able to deal with intersymbol interference (ISI) introduced by transmission channel artifacts as well as by modulation and pulse shaping components in the transmission path of a remote transceiver system. During the demodulation and decoding process of Trellis coded information, ISI components are introduced by either means must also be considered and compensated, further expanding the computational complexity and thus, system latency of the transceiver system. Without a transceiver system capable of efficient, high-speed signal decoding as well as simultaneous ISI compensation, gigabit Ethernet would likely not remain a viable concept.

According to Azadet et al. in the article entitled "A 1-Gb/s Joint Equalizer and Trellis Decoder for 1000BASE-T Gigabit Ethernet" published in the IEEE Journal of Solid-state Circuits, Vol. 3 6, NO. 3, March 2001, which is incorporated herein by reference, a 14-tap parallel decision-feedback decoder (PDFD) is described. As the hardware complexity of the DFU accounts for the majority of the hardware complexity of the PDFD, In order to reduce the hardware complexity of the PDFD, the article proposes using, a 1-tap PDFD having decision-feedback prefilters used for each wire pair to shorten the channel memory to one is also proposed in the article, for the hardware complexity of the DFU accounts for the majority of the hardware complexity of the PDFD. However, the proposed solution significantly increases the bit error rate of the PDFD because only 1-tap is used and therefore the ISI is not effectively removed.

SUMMARY OF INVENTION

One objective of the claimed invention is therefore to provide a method for efficient and high-speed joint equalizing and decoding of an incoming data stream.

According to an exemplary embodiments of the present invention, a method is disclosed for joint equalizing and decoding of an incoming data stream in a P-tap parallel decision-feedback decoder (PDFD) is disclosed. The method comprises: shifting a plurality of survivor metrics into a plurality of first shift registers, wherein for each state of a code utilized by the incoming data stream, a survivor metric for a state is shifted into a first shift register for the state, each state shift register having M cells; choosing a first survivor metric according to survivor metrics in the first shift registers; and shifting the first survivor metric into a second shift register having N cells.

According to an exemplary embodiments of the present invention, a P-tap parallel decision-feedback decoder (PDFD) is also disclosed. The PDFD comprises: a plurality of state shift registers, wherein for each state of a code utilized by an incoming data stream, a survivor metric for a state is shifted into the first shift register for the state, each first shift register having M cells; a decision device coupled to the first shift registers for outputting a first survivor metric according to survivor metrics in the first shift registers; and a second shift register having N delay cells, wherein the first survivor metric is shifted into the second shift register.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
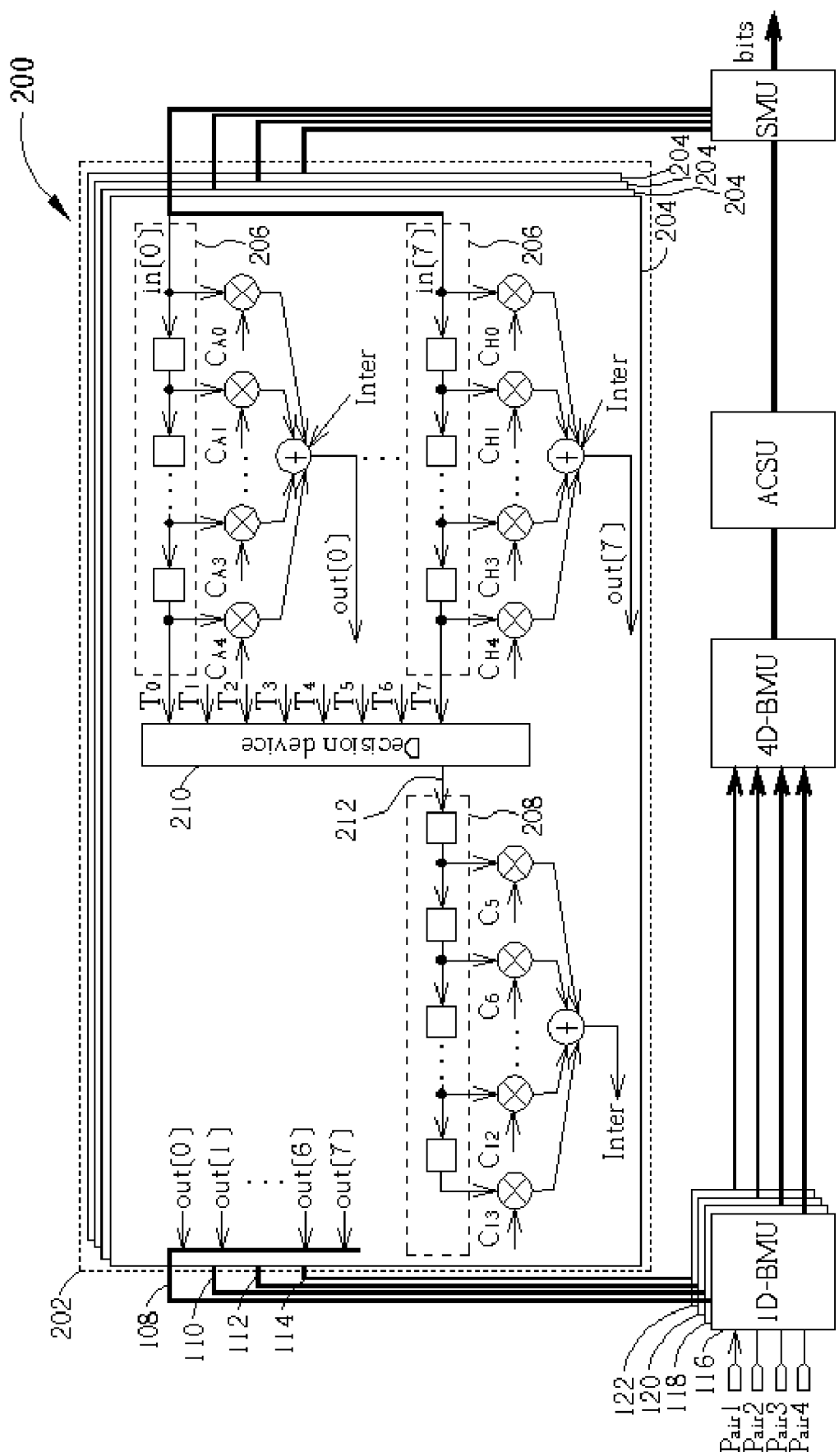
FIG. 1 is a 14-tap PDFD according to an embodiment of the present invention.

FIG. 1 shows a 14-tap PDFD 200 according to an embodiment of the present invention. The PDFD 200 comprises a 4-set one-dimensional branch metric unit (1D-BMU), a four-dimensional branch metric unit (4D-BMU), an add-compare-select unit (ACSU), and a survivor metric unit (SMU), whose composition and function are well known to those who have ordinary skill in the art. The PDFD 200 also comprises a decision feedback unit (DFU) 202. To comply with the standard, the DFU 202 is actually composed of four sets 204.

In this embodiment of the present invention, each set 204 includes eight state shift registers 206, a single shift register 208, and a decision device 210. The eight shift registers 206 respectively correspond to the eight Trellis states. Each state shift register 206 contains 5 cells (corresponding to 5-taps of the PDFD 200), and the single shift register 208 contains 9 cells (corresponding to 9-taps of the PDFD 200). Because experimental results have shown that it is of relatively high probability that a majority of the survivor metrics of the Viterbi decoding process have converged by a certain tap, for example, the fifth tap, this embodiment utilizes the single shift register 208 after the fifth tap instead of multiple shift registers. Hardware complexity is therefore largely reduced, and latency decreased. The decision device 210 is then introduced to choose an appropriate survivor metric 212 from the eight state shift registers 206 and shifts the chosen survivor metric 212 into the single shift register 208.

For each state, each of 5 survivor metrics respectively output from the state shift register 206 is multiplied by a respective coefficient: $C_{A0}$ to $C_{A4}$ for each cell in the first state shift register 206, $C_{B0}$ to $C_{B4}$ for each cell in the second state shift register 206, . . . , and $C_{H0}$ to $C_{H4}$ for each cell in the eighth state shift register 206. Meanwhile, each of the 9 survivor metrics output from the single shift register 208 is multiplied by a respective coefficient $C_5$ to $C_{13}$ and the results of the single shift register 208 multiplications are summed to form an intermediate value Inter. The results of each of the state shift register 206 multiplications are summed together with the intermediate value Inter calculated according to the single shift register 208. In this way, an ISI value for each state (out[0] to out[7], for each of the eight states, respectively) is formed by five-taps being unique to the state and nine taps being common to all the states. The results of the summing operations (out[0] to out[7]) for each set 104 are output back to the 1D-BMUs 116, 118, 120, 122 as output signals 108, 110, 112, and 114, respectively, and allow postcursor ISI to be removed. It is to be noted that the distribution of number of taps between the state shift registers and the single shift register is a design choice, and is not meant to serve as limitation.

Figure 2:
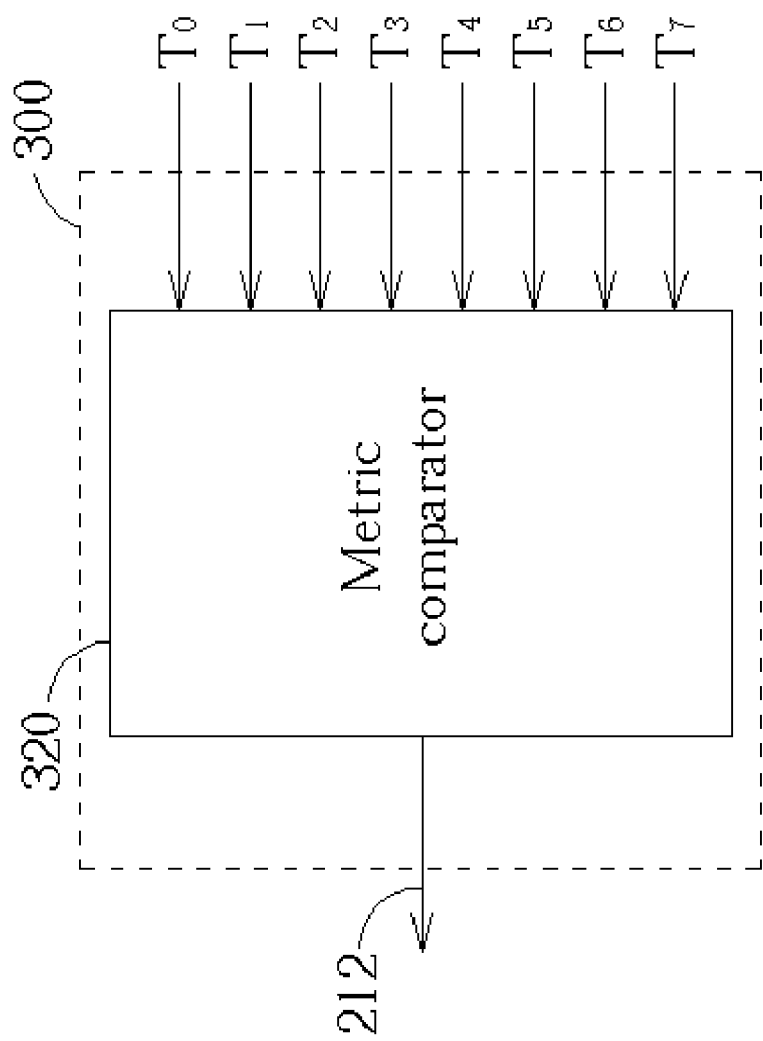
FIG. 2 is a block diagram detailing the implementation of a first embodiment decision device for use as the decision device of FIG. 1.

FIG. 2 is a block diagram detailing the implementation of a first embodiment decision device 300 for use as the decision device 210 of FIG. 1. The first decision device 300 compares the survivor metrics at the outputs $T_0$, $T_1$, $T_2$, $T_3$, $T_4$, $T_5$, $T_6$, $T_7$ of the stat shift registers 206 shown in FIG. 1. The decision device 300 chooses a survivor metric 212 according to the survivor metrics at the last taps (i.e. the $5^{th}$ taps) of the state shift registers 206. In this embodiment, the chosen survivor metric 212 outputted by the first decision device 300 is the survivor metric being present at the greatest number of outputs $T_0$, $T_1$, $T_2$, $T_3$, $T_4$, $T_5$, $T_6$, $T_7$ of the state shift registers 206. For example, if a particular survivor metric is received on outputs $T_0$, $T_1$, $T_3$, $T_4$, $T_6$, and $T_7$, this particular survivor metric has the most likelihood among others, is considered the most possible convergence, and is therefore chosen.

Figure 3:
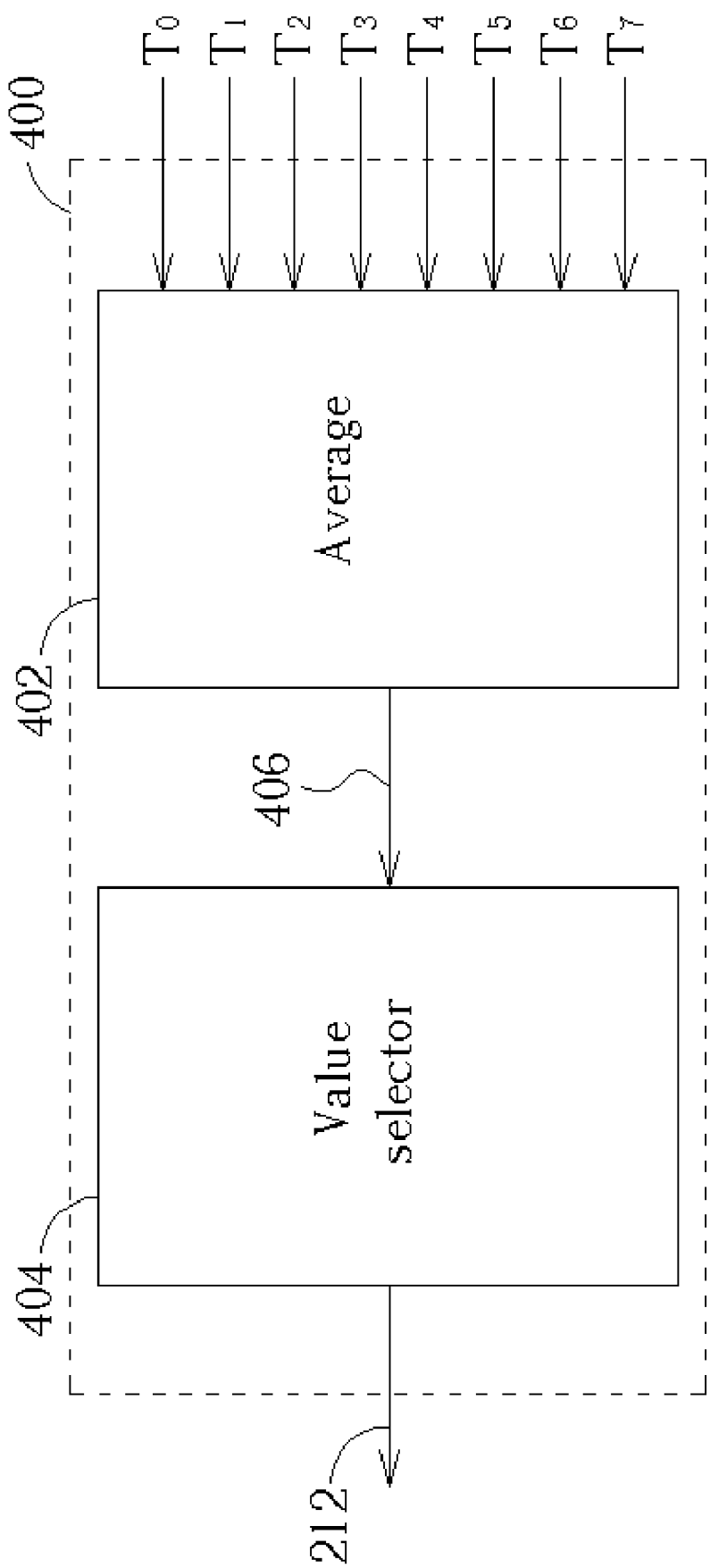
FIG. 3 is a block diagram detailing the implementation of a second embodiment decision device for use as the decision device of FIG. 1.

FIG. 3 is a block diagram detailing the implementation of a second embodiment decision device 400 for use as the decision device 210 of FIG. 1. The second decision device 400 includes an average unit 402 and a value selector 404. The average unit 402 simply averages the survivor metrics received on the outputs $T_0$, $T_1$, $T_2$, $T_3$, $T_4$, $T_5$, $T_6$, $T_7$ of the state shift registers 206. The average value 406 output by the average unit 402 is used by the value selector 404 to determine the appropriate survivor metric 212, which is then output by the second decision device 400. In this embodiment, the value selector 404 selects a survivor metric being closest to the average value 406. In this way, as long as there is a clear majority of states that have converged to the same survivor metric, the survivor metric 212 outputted by the second decision device 400 will resemble the survivor metric 212 outputted by the first decision device 300.

It will be evident to one having skill in the art that although the PDFD 200 has been described in the context of a Trellis encoded data stream communicated over a multi-pair transmission channel, the present invention is not limited to any particular communication technique. Specifically, the decoder architecture and signal processing methodology in accord with the present invention is suitable for use with any form of communication in which the symbolic content of the communication is represented by multi-level signals.

Neither is the present invention limited to signals encoded in accordance with a 4D, eight-state, Trellis methodology. Trellis encoding forces the system to be constructed so as to accommodate the eight states inherent in the Trellis methodology used by Gigabit Ethernet. Other coding methodologies and architectures are expressly contemplated by the present invention and can be implemented by making the proper modifications to an alternative coding architecture's "state width", as will be apparent to a skilled integrated circuit transceiver designer. Likewise, the "dimensional depth", 1D, 2D, 4D . . . for example, may be suitably increased, or decreased to accommodate different forms of transmission channel implementations such as twisted pair cabling, single conductor cabling, parallel wireless channels, and the like.

Figure 4:
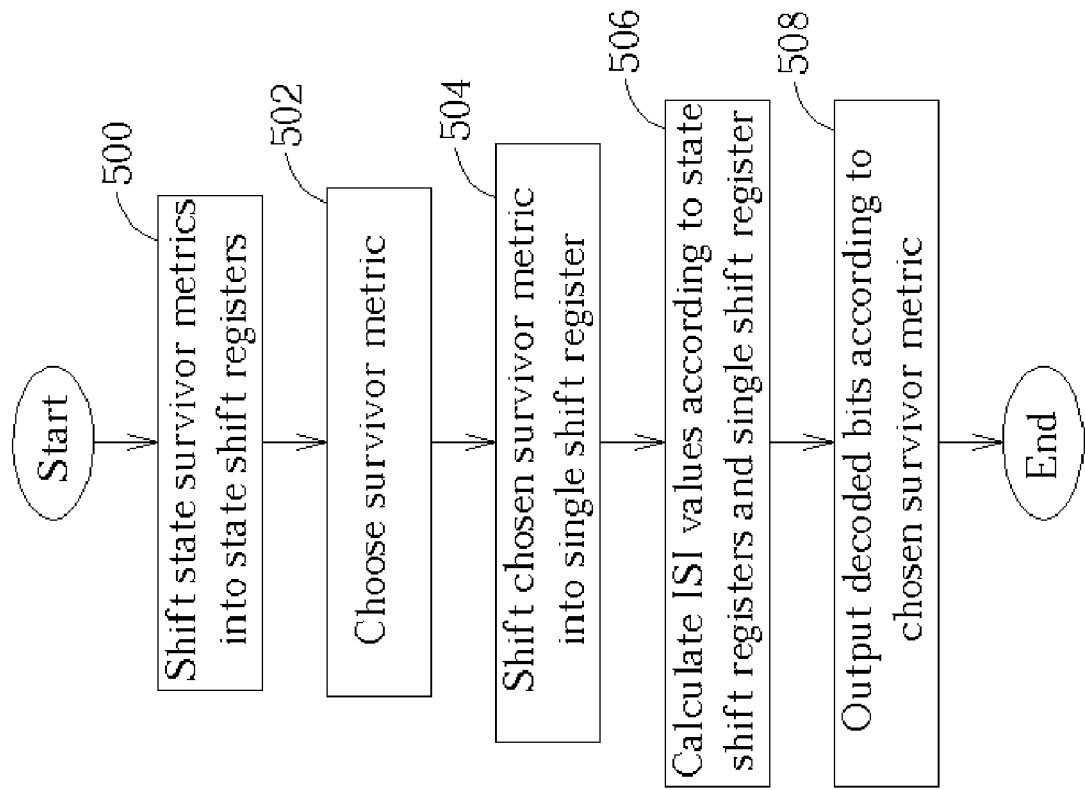
FIG. 4 is a flowchart describing a general method of joint equalizing and decoding of an incoming data stream in a P-tap PDFD according to an embodiment of the present invention.

Accordingly, FIG. 4 is a flowchart describing a general method of joint equalizing and decoding of an incoming data stream in a P-tap PDFD according to an embodiment of the present invention. The flowchart contains the following steps:

Step 500: Shift survivor metrics for a plurality of states into a plurality of state shift registers. For each state of a coding methodology utilized by the incoming data stream, shift one survivor metric for the state into a state shift register for the state. Each state shift register has M cells, where each cell represents a single tap in the PDFD architecture.

Step 502: Choose an appropriate survivor metric according to the survivor metrics stored in the state shift registers. In one embodiment of the present invention, average the survivor metrics at the $M^{th}$ cells (the last cells) of the state shift registers and then select a survivor metric being closest to the average. In another embodiment of the present invention, select a most frequent survivor metric being present at the greatest number of $M^{th}$ cells of the state shift registers.

Step 504: Shift the chosen survivor metric in step 502 into a single shift register. The single shift register has N cells, where M plus N is equal to the total number of taps P in the PDFD.

Step 506: Calculate an ISI value for each state according to the state shift register for the state and the single shift register. To calculate the ISI value, multiply the survivor metrics at the M cells of the state shift register for the state and at the N cells of the single shift register with a respective coefficient. Then sum the results of the multiplication. In this way, the P-tap ISI value for each state is formed by M-taps being unique to the state and N taps being common to all the states.

Step 508: Output decoded bits determined according to the chosen survivor metric determined in Step 502. In this way, hardware complexity of the high-speed decoder is reduced.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for joint equalizing and decoding of an incoming data stream in a P-tap parallel decision-feed-back decoder (PDFD), the method comprising:
    shifting a plurality of survivor metrics into a plurality of first shift registers, wherein for each state of a code utilized by the incoming data stream, a survivor metric for a state is shifted into a first shift register for the state, each first shift register having M cells;
    choosing a first survivor metric according to survivor metrics in the first shift registers; and
    shifting the first survivor metric into a second shift register having N cells.

2. The method of claim 1, further comprising calculating an inter-symbol interference (ISI) value for each state according to the survivor metrics at the M cells of the first shift register for the state and according to the survivor metrics at the N cells of the second shift register.

3. The method of claim 2, wherein calculating the ISI value for a particular state comprises summing the results of multiplying the survivor metrics at the M cells of the first shift register for the particular state and at the N cells of the second shift register with a respective coefficient.

4. The method of claim 1, wherein choosing the first survivor metric comprises choosing the first survivor metric according to the survivor metrics at the $M^{th}$ cells of the first shift registers.

5. The method of claim 4, wherein choosing the first survivor metric further comprises selecting a most frequent survivor metric being present at the greatest number of $M^{th}$ cells of the first shift registers as the first survivor metric.

6. The method of claim 4, wherein choosing the first survivor metric further comprises averaging the survivor metrics at the $M^{th}$ cells of the first shift registers and then selecting a survivor metric being closest to the average as the first survivor metric.

7. The method of claim 1, further comprising performing Viterbi decoding of the incoming data stream.

8. The method of claim 1, wherein the code utilized by the incoming data stream is a Trellis code.

9. The method of claim 1, wherein P is equal to M plus N.

10. A P-tap parallel decision-feedback decoder (PDFD) comprising:
    a plurality of state first shift registers, wherein for each state of a code utilized by an incoming data stream, a survivor metric for a state is shifted into the first shift register for the state, each first shift register having M cells;
    a decision device coupled to the first shift registers for outputting a first survivor metric according to survivor metrics in the first shift registers; and
    a second shift register having N delay cells, wherein the first survivor metric is shifted into the second shift register.

11. The PDFD of claim 10, further comprising a plurality of inter-symbol interference (ISI) value calculators for calculating an ISI value for each state according to the survivor metrics at the M cells of the first shift register for the state and according to the survivor metrics at the N cells of the second shift register.

12. The PDFD of claim 11, wherein the ISI value calculator for a particular state comprises:
    a plurality of multipliers for multiplying the survivor metrics at the M cells of the first shift register for the particular state and at the N cells of the second shift register with a respective coefficient; and
    a summing unit coupled to the outputs of the plurality of multipliers for summing the results of the multiplications and outputting the ISI value.

13. The PDFD of claim 10, wherein the decision device chooses the first survivor metric according to the survivor metrics at the $M^{th}$ cells of the first shift registers.

14. The PDFD of claim 13, wherein the decision device chooses the first survivor metric by selecting a most frequent survivor metric being present at the greatest number of $M^{th}$ cells of the first shift registers as the first survivor metric.

15. The PDFD of claim 13, wherein the decision device chooses the first survivor metric by averaging the survivor metrics at the $M^{th}$ cells of the first shift registers and then selecting a survivor metric being closest to the average as the first survivor metric.

16. The PDFD of claim 10 is for Viterbi decoding of the incoming data stream.

17. The PDFD of claim 10, wherein the incoming data stream is a four-dimensional gigabit Ethernet stream utilizing an 8-state Trellis code.

18. The PDFD of claim 10, wherein P is equal to M plus N.

19. A P-tap parallel decision-feedback decoder (PDFD) comprising:
    a plurality of X first shift registers, wherein for each state of a code utilized by an incoming data stream, a survivor metric for a slate is shifted into the first shift register for the state, each first shift register having M cells;
    a first decision device coupled to the first shift registers for outputting a first survivor metric according to survivor metrics in the first shift registers;
    a plurality of Y second shift registers, wherein the first survivor metric for a state is shifted into the second shift register for the state, each second shift register having N cells; and
    a second decision device coupled to the second shift registers for outputting a second survivor metric according to survivor metrics in the second shift registers,
    wherein X is greater than Y.

20. The PDFD of claim 19, wherein the first decision device chooses the first survivor metric by selecting a most frequent survivor metric being present at the greatest number of $M^{th}$ cells of the first shift registers as the first survivor metric.

21. The PDFD of claim 19, wherein the first decision device chooses the first survivor metric by averaging the survivor metrics at the $M^{th}$ cells of the first shift registers and then selecting a survivor metric being closest to the average as the first survivor metric.

22. The PDFD of claim 19, wherein the second decision device chooses the second survivor metric by selecting a most frequent survivor metric being present at the greatest number of $N^{th}$ cells of the second shift registers as the second survivor metric.

23. The PDFD of claim 19, wherein the second decision device chooses the second survivor metric by averaging the survivor metrics at the $N^{th}$ cells of the second shift registers and then selecting a survivor metric being closest to the average as the second survivor metric.

* * * * *